Nov. 17, 1964 E. F. M. DE MASI 3,157,733

ELECTRIC CIRCUIT PANEL FOR COMPONENTS

Filed May 11, 1962 3 Sheets-Sheet 1

INVENTOR.
ERNEST F.M. DEMASI
BY Krazinski + Nolan
ATTORNEYS

Nov. 17, 1964 E. F. M. DE MASI 3,157,733

ELECTRIC CIRCUIT PANEL FOR COMPONENTS

Filed May 11, 1962 3 Sheets-Sheet 2

INVENTOR.
ERNEST F.M. DE MASI
BY Krazinski & Nolan
ATTORNEYS

Nov. 17, 1964 E. F. M. DE MASI 3,157,733

ELECTRIC CIRCUIT PANEL FOR COMPONENTS

Filed May 11, 1962 3 Sheets-Sheet 3

INVENTOR.
ERNEST F.M. DE MASI
BY Kraguski & Nolan
ATTORNEYS

United States Patent Office 3,157,733
Patented Nov. 17, 1964

3,157,733
ELECTRIC CIRCUIT PANEL FOR COMPONENTS
Ernest F. M. De Masi, 9108 Colonial Road,
Brooklyn 9, N.Y.
Filed May 11, 1962, Ser. No. 194,093
1 Claim. (Cl. 174—68.5)

The present invention relates to electric circuits and, more particularly, to an improved electric circuit panel for electrical or electronic components and the method and apparatus for making the panel.

Presently, so called printed electrical circuits are being used extensively because of the relatively low cost thereof. Such printed circuits usually comprise a plate formed of dielectric material, such as a plastic resin and a film of electrically conductive material adhered to the plate and arranged to provide a circuit for connecting the components, namely, miniature resistors, capacitors, transistors, thermisters, fuses and the like, therein.

However, such printed circuits have the disadvantage that the conductive film is readily impaired by flexing the plate, scraping the film in rough handling thereof or by burning out the film while soldering the components thereto. Because of this delicate nature of the printed circuit a great number of the finished circuits fail to pass inspection and are rejected, whereby the labor cost of connecting the components and the cost of making the circuits greatly reduces the manufacturing economy of such circuits.

Accordingly, an object of the present invention is to provide an electrical circuit for connecting components therein which overcomes the prior disadvantages of and objections to printed circuits.

Another object is to provide such circuits which are rugged and indestructible but yet are economical to manufacture.

A further object is to provide such circuits which have all the advantages of so-called printed circuits and are arranged to facilitate connection of the components therein.

Other and further objects will be obvious upon an understanding of the illustrative embodiment about to be described, or will be indicated in the appended claim, and various advantages not referred to herein will occur to one skilled in the art upon employment of the invention in practice.

A preferred embodiment of the invention has been chosen for purposes of illustration and description and is shown in the accompanying drawings, forming a part of the specification, wherein.

Figure 3:
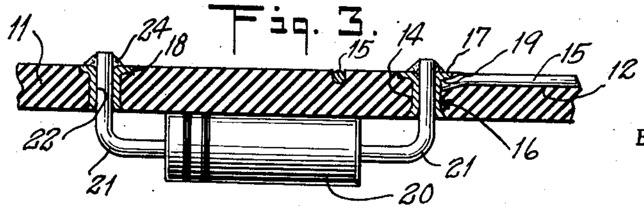
FIG. 3 is an enlarged sectional view taken along the line 3—3 on FIG. 1.

Referring now to FIGS. 1 to 4 of the drawings in detail, there is shown an electric circuit panel 10 comprising a plate 11 formed of dielectric material, such as plastic resin having a plurality of grooves 12 on one side thereof and having apertures 14 extending therethrough at the ends of the grooves, an electrically conductive wire 15 disposed in each of the grooves and extending from the aperture at one end of its groove to the aperture at the other end of its groove, and an electrically conductive eyelet 16 in each of the apertures 14 having a flange portion 17 overlying an end of a wire and being in electrical connection therewith (FIG. 3).

Preferably, the grooves 12 have a depth so that the outer surfaces of the wires 15 are about flush with the panel plate surface; and the apertures 14 have a counterbore 18 at the side of the plate where the grooves are formed for receiving the ends of the wires and the flange portions 17 of the eyelets 16, so that the flange portions also are about flush with the plate surface. The eyelets 16 are structurally secured to the plate 11 in a conventional manner and the flange portions 17 are brazed, soldered or welded to the ends of the wires at 19, preferably by electric welding, to provide a permanent electrical connection between the wires and the eyelets.

The panel plate constructed in the foregoing manner simulates a printed circuit but is more rugged and durable than a printed circuit.

As shown herein, the eyelets 16 also serve as means for electrically connecting miniature electrical or electronic components 20 in the circuit. This is accomplished by inserting the terminal wires 21 of the components in the central bore 22 of the eyelet. The terminal wires may be in frictional engagement with the eyelets to facilitate assembly of the components and temporary securement in the circuit, and thereafter may be permanently secured by soldering the same to eyelets at 24 (FIG. 3).

Figure 1:
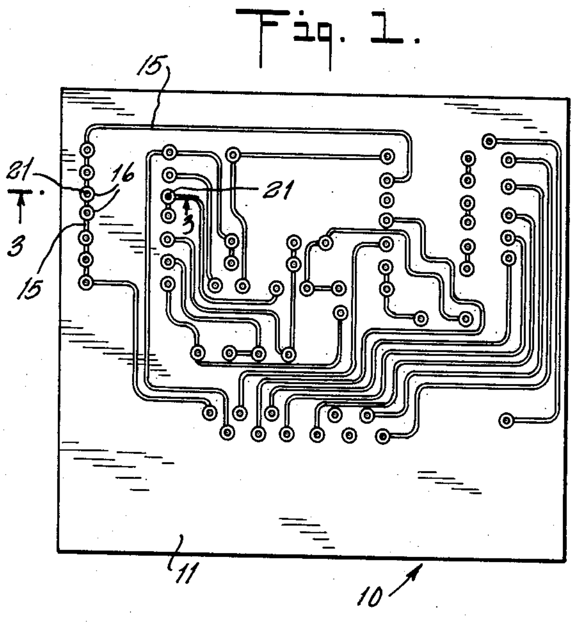
FIG. 1 is a top plan view of an electrical circuit panel in accordance with the present invention.
Figure 4:
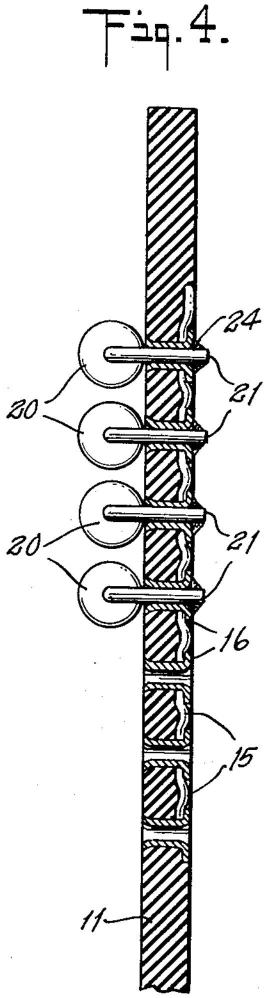
FIG. 4 is an enlarged sectional view taken along the line 4—4 on FIG. 2.
Figure 2:
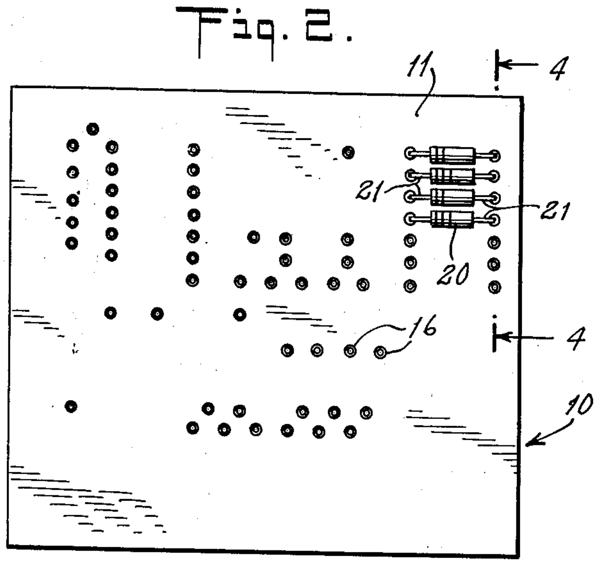
FIG. 2 is a bottom plan view of the circuit panel shown in FIG. 1.

The length and contour of the grooves can be varied as required. Certain of the grooves may be relatively long (FIG. 1) while others may be relatively short (FIG. 4).

In FIGS. 5 to 8, apparatus is shown for forming the grooves 12 in the plate 11 which apparatus generally comprises a support 30; means 31 for holding a diagram 32 of a circuit on the support; means 34 for holding a plate 11 on the support; and a pantograph 35 including a pivot 36 mounted on the support, a tracer 37 for following the diagram and a cutter 38 for forming the grooves in the plate 11. Preferably, the pantograph is arranged to reproduce the diagram on the plate at a reduced scale.

Figures 5, 6, 7, 8:
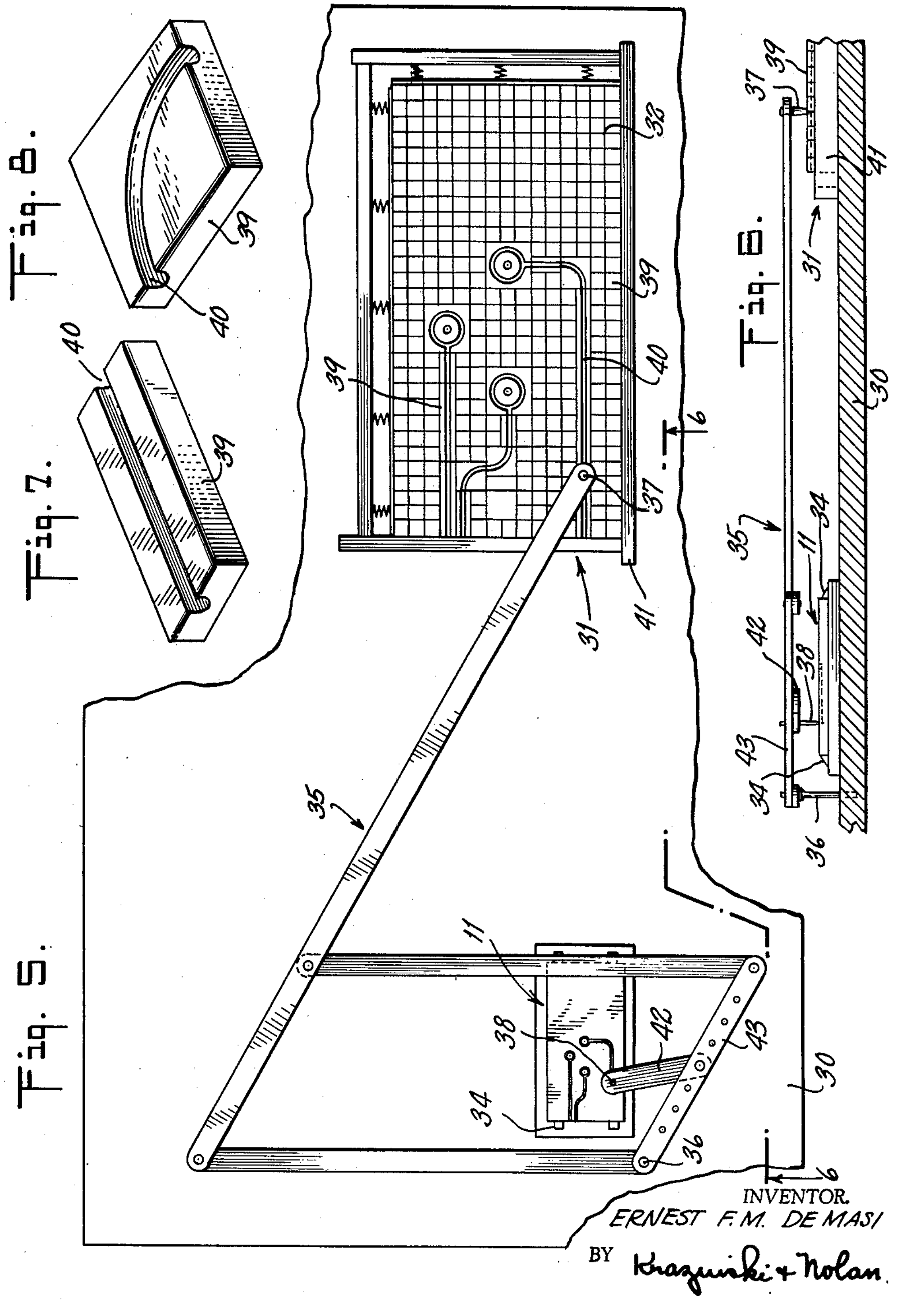
FIG. 5 is a plan view of apparatus utilized for producing grooves in a panel plate for laying electrically conductive wires therein which wires provide the circuits.
FIG. 6 is a sectional view taken along line 6—6 on FIG. 5.
FIGS. 7 and 8 are enlarged perspective views of grooved blocks of the apparatus shown in FIG. 5, which grooves are reproduced on the panel plates.

While the diagram 32 may be constructed and arranged in any suitable manner, the diagram shown herein for purposes of illustration comprises a group of rectangular blocks 39 with some of the blocks having straight or arcuate grooves 40 therein (FIGS. 7 and 8). These blocks are arranged in a frame 41 to simulate the path of the grooves 12 in the plate 11 by means of grooves 40. Such a diagram is rugged and durable and can be traced many times without wear. Also, the blocks can be arranged and rearranged to provide any desired circuit to be traced, whereby separate diagrams for each circuit need not be kept in stock.

The pantograph 35 is conventional in construction except that a marker is replaced by the cutter 38. As shown in FIGS. 5 and 6, the cutter 38 is secured to and depends from an arm 42, secured to one of the bars 43 of the pantograph for movement therewith. The bar 43 may have a plurality of spaced apertures for adjusting the position of the cutter 38 to vary the scale of the reproduced grooves.

Figure 9:
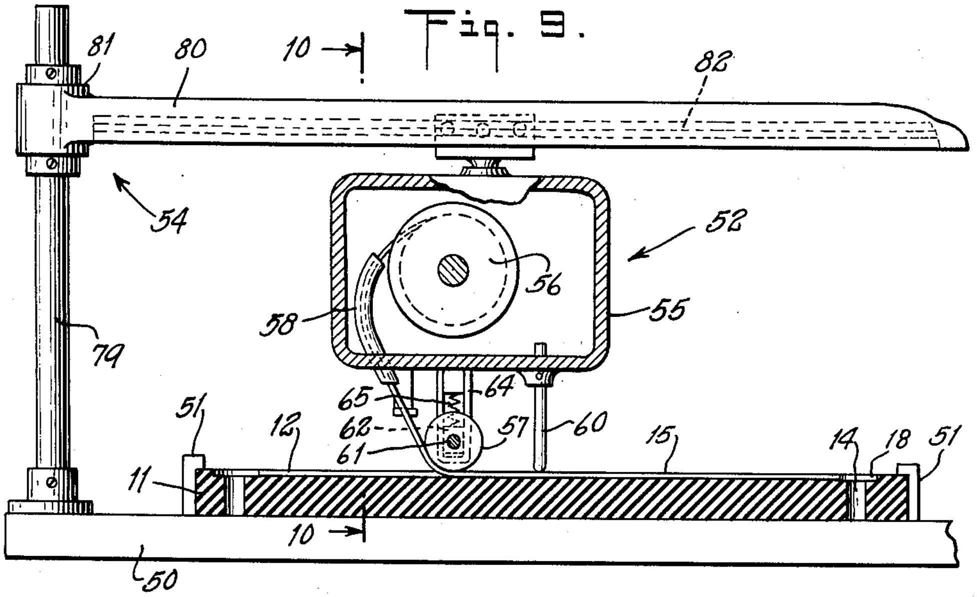
FIG. 9 is a view partly in elevation and partly in section of apparatus for laying wire in the grooves of the panel plate.
Figure 10:
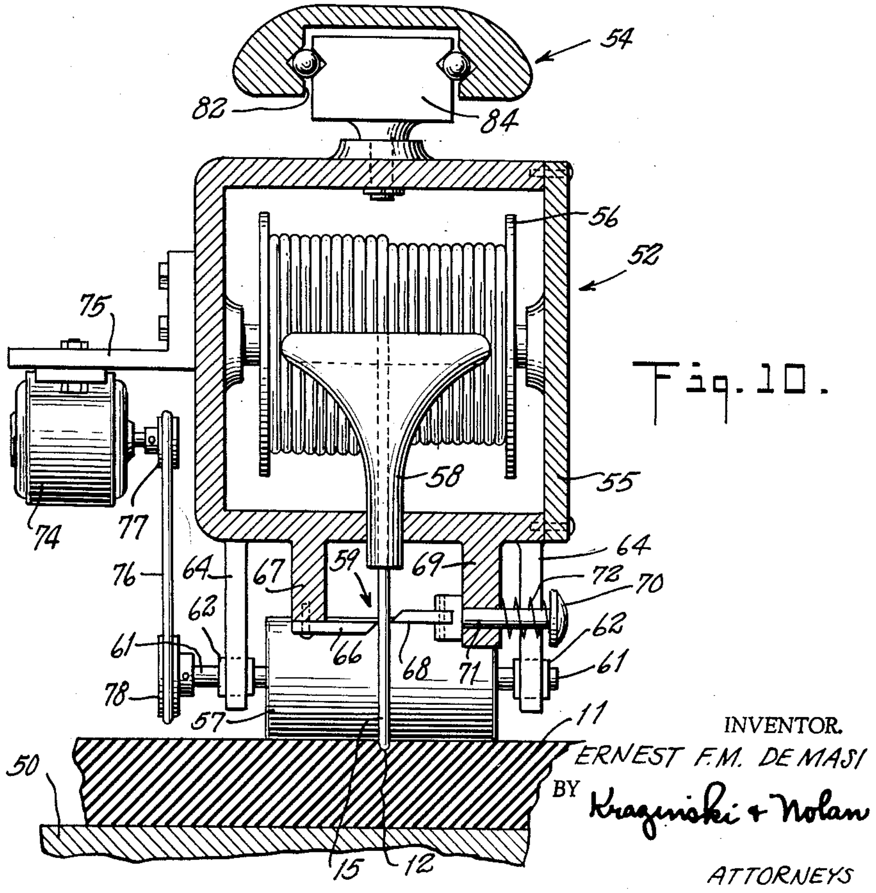
FIG. 10 is an enlarged sectional view taken along the line 10—10 on FIG. 9.

In FIGS. 9 and 10 apparatus is shown for laying the wires 15 in the grooves 12 of the plate 11, which apparatus generally comprises a support 50, means 51 for holding the plate 11 on the support, means 52 for laying wire in the grooves, and means 54 for mounting the wire laying means 52 over the support 50 for arcuate and lineal movement across the plate 11.

The wire laying means 52 comprise a casing 55, a supply of wire, such as a spool 56 rotatably mounted in the casing, a roller 57 for pressing the wire 15 into the grooves 12, a tube 58 for guiding the wire from the spool to beneath the roller, a cutter 59 between the tube 58 and the roller 57 for severing the wire 15, and a member 60 following the roller for ironing the wire down into the grooves.

The roller 57 is rotatably mounted on a shaft 61 having its ends disposed in bearings 62 each slidably mounted in a vertical guide 64 depending from the casing 55. Each bearing is urged downwardly by a spring 65, whereby the roller 57 is urged against the plate 11 to press the wire into the grooves.

The cutter 59 comprises a fixed shearing blade 66 secured to a lug 67 depending from the casing 55, a movable shearing blade 68 slidably supported by a lug 69 depending from the casing, a manually operated push button 70 on a rod 71 connected to the blade 68 for effecting operation thereof, and a spring 72 between the lug 69 and the button for normally retracting the blade 68 out of cutting position.

Preferably, motor means are provided for driving the roller 57 at a slow speed and with just sufficient torque to induce rotary motion of the roller in a counterclockwise direction, as viewed in FIG. 9. As shown in FIG. 10, such motor means may comprise an electric motor 74 mounted on a bracket 75 secured to the casing 55, and a belt 76 providing a driving connection between a pulley 77 on the motor shaft and a pulley 78 on the roller shaft 61.

The mounting means 54 comprise an upright rod 79 secured to the support 50, an arm 80 journalled at one end 81 for pivotal movement about the rod 79 and having a lengthwise extending guideway 82 therein, and a slide 84 mounted in the guideway 82 for lineal and rotary movement, and being secured to the casing 55 for movably supporting the wire laying means, whereby the roller 57 can be manipulated to place the wire in straight and arcuate groove portions in the plate 11.

The method of making the circuit panel shown herein comprises locating the centers of the apertures 14 on the plate 11 and cutting the grooves 12 in the plate by following the diagram in the manner shown in FIGS. 5 and 6, and then drilling the apertures 14 and the counterbores 18, best shown in FIG. 9.

The grooved and apertured plate 11 is then held on the support 50 (FIGS. 9 and 10) and the wires are laid in the grooves and are pressed and ironed therein to unite the wires structurally with the plate. The wire is started from the aperture at one end of a groove and is laid, pressed and ironed in the groove until sufficient wire is unrolled to reach the aperture at the other end of the groove. The wire shearing blade 68 is then operated to sever the wire at the point providing the end adapted to reach the last mentioned aperture of the groove, and movement of the roller 57 is continued to lay, press and iron the remaining portion of the wire in the groove.

After the grooves 12 have been filled with wires 15 with the ends of the wires extending into the counterbores 18, the eyelets 16 are inserted into the apertures 14, so that the flange portions 17 thereof overlie the ends of the wires. Preferably, the apertures 14 and the eyelets 16 are dimensioned so that the eyelets are frictionally retained in the apertures to provide a temporary assembly. Thereafter the ends of the eyelets opposite the flange portions 17 are expanded to structurally secure the eyelets to the plate 11. At the same time the eyelets are so secured, an electric welding current may be applied across the flange portions and the ends of the wires to produce the weld at 19.

After the wires and eyelets have been so assembled, the components 20 are connected in the circuit panel by inserting the terminal wires 21 of the components into the eyelet bores 22, and applying solder at 24.

From the foregoing description, it will be seen that the present invention provides a simple, practical and economical apparatus for and method of making a circuit panel which has all the advantages of a printed circuit and none of the disadvantages thereof. The circuit panels are compact, light in weight and durable, and cannot be damaged during fabrication or assembly thereof.

As various changes may be made in the form, construction, and arrangement of the parts herein, without departing from the spirit and scope of the invention and without sacrificing any of its advantages, it is to be understood that all matters are to be interpreted as illustrative and not in any limiting sense.

What is claimed is:

An electric circuit panel comprising a plate of dielectric material having a plurality of grooves engraved on one side thereof and having drilled apertures extending therethrough at the ends of the grooves, said apertures each having a counterbore at the side of said plate having said grooves therein, an electrically conductive wire pressed in each of said grooves extending from one aperture to the other aperture of said grooves, said engraved grooves having a depth such that outer surface of said wire is flush with surface of said plate, and an electrically conductive eyelet in each of said apertures having a flange portion overlying and in electrical connection with an end of one of said wires, said flange portions and the ends of said wires being disposed in said counterbores.

References Cited in the file of this patent

UNITED STATES PATENTS

| | | |
|---|---|---|
| 2,832,013 | Pedersen et al. | Apr. 22, 1958 |
| 2,910,628 | Keener | Oct. 27, 1959 |
| 3,002,481 | Hutters | Oct. 3, 1961 |
| 3,037,265 | Kallmeier | June 5, 1962 |
| 3,079,672 | Bain et al. | Mar. 5, 1963 |
| 3,088,191 | Breiling | May 7, 1963 |